(12) United States Patent
Sutono et al.

(10) Patent No.: US 12,113,265 B2
(45) Date of Patent: Oct. 8, 2024

(54) DUAL-STRIPLINE WITH CROSSTALK CANCELLATION

(71) Applicant: Intel Corporation, Santa Clara, CA (US)

(72) Inventors: Albert Sutono, Chandler, AZ (US); Xiaoning Ye, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 685 days.

(21) Appl. No.: 17/214,111

(22) Filed: Mar. 26, 2021

(65) Prior Publication Data

US 2022/0311114 A1 Sep. 29, 2022

(51) Int. Cl.
| | |
|---|---|
| H01L 23/49 | (2006.01) |
| H01L 23/498 | (2006.01) |
| H01L 23/528 | (2006.01) |
| H01L 23/66 | (2006.01) |
| H01P 3/08 | (2006.01) |
| H05K 1/02 | (2006.01) |

(52) U.S. Cl.
CPC .......... *H01P 3/08* (2013.01); *H01L 23/49838* (2013.01); *H01L 23/5283* (2013.01); *H01L 23/66* (2013.01); *H05K 1/0228* (2013.01); *H01L 23/49822* (2013.01); *H01L 2223/6627* (2013.01)

(58) Field of Classification Search
None
See application file for complete search history.

(56) References Cited

U.S. PATENT DOCUMENTS

| | | | | |
|---|---|---|---|---|
| 6,611,181 | B2* | 8/2003 | Marketkar | H05K 1/0239 333/24 R |
| 9,131,604 | B1* | 9/2015 | Watt | H05K 1/0245 |
| 2003/0222727 | A1* | 12/2003 | McCurdy | H01P 3/088 333/236 |
| 2007/0119615 | A1 | 5/2007 | Kobayashi | |
| 2011/0025428 | A1* | 2/2011 | Merritt | H01P 3/026 333/1 |
| 2012/0228006 | A1* | 9/2012 | Chen | H05K 1/0219 174/251 |

(Continued)

OTHER PUBLICATIONS

International Search Report and Written Opinion for International Application PCT/US2022/017736 mailed Jun. 13, 2022, 8 pgs.

(Continued)

*Primary Examiner* — Bilkis Jahan
(74) *Attorney, Agent, or Firm* — Schwabe, Williamson & Wyatt P.C.

(57) ABSTRACT

Electronic structures including a dual-stripline with crosstalk cancellation are described. In an example, a printed circuit board (PCB), a package substrate or a semiconductor die includes a dual-stripline structure. The dual-stripline structure includes a first region including a first top line vertically over a first bottom line, and a second top line vertically over a second bottom line. The dual-stripline structure also includes a second region including the first top line vertically over the second bottom line, and the second top line vertically over the first bottom line. The dual-stripline structure also includes a transition region between the first region and the second region. The first bottom line and the second bottom line cross in the transition region.

21 Claims, 16 Drawing Sheets

(56) References Cited

U.S. PATENT DOCUMENTS

2014/0266490 A1    9/2014  Xiao et al.
2017/0064817 A1*   3/2017  Lam ..................... H05K 1/0245

OTHER PUBLICATIONS

International Preliminary Report on Patentability for International Application PCT/US2022/017736 mailed Oct. 5, 2023, 5 pgs.

* cited by examiner

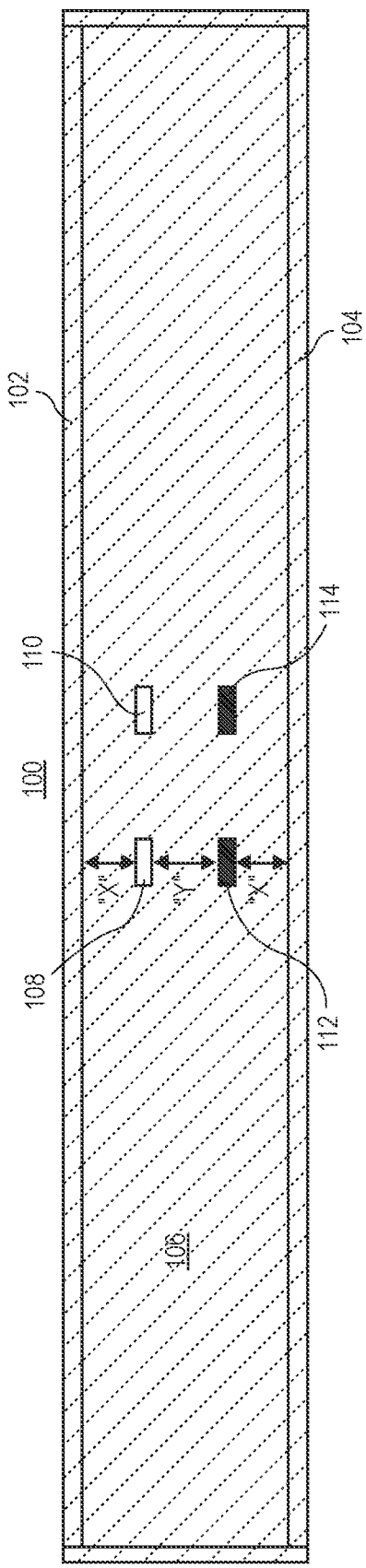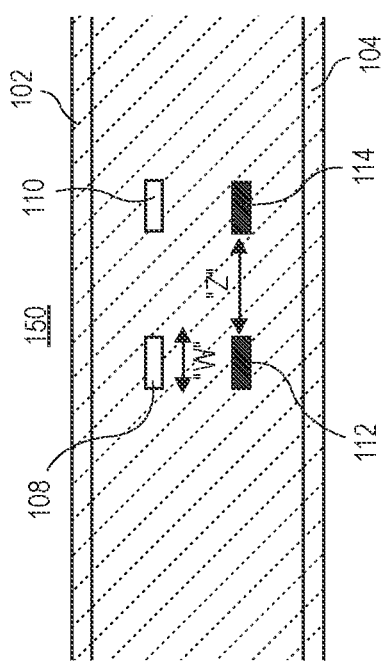

DUAL-STRIPLINE WITH CROSSTALK CANCELLATION

TECHNICAL FIELD

Embodiments of the present disclosure relate to electronic packaging, semiconductor devices or printed circuit boards (PCBs), and more particularly, to electronic packaging, semiconductor devices or printed circuit boards (PCBs) architectures that utilize a dual-stripline with crosstalk cancellation independent of manufacturing variation.

BACKGROUND

With more performance required per socket and as more cores are added into the CPU, memory bandwidth demand is the key enabler for scaling CPU performance. Due to the high density routing in package, crosstalk in the package, PCB and semiconductor die is the major barrier to reach higher memory speeds for single ended interfaces.

The current approach for routing in package is to increase the input/output (I/O) bump pitch and use conventional stripline routing (defined as a single signal layer sandwiched between two ground or reference layers). Particularly, as silicon processes continuing to shrink, and the number of high-speed I/O channels increase with higher speeds, conventional stripline routing is not cost-effective. To increase routing density, an additional signal layer is inserted between the first signal layer and reference but the crosstalk in this stripline routing architectures makes such routing solutions impracticable for continued scaling. This disclosure contains a design that overcome such limitation.

BRIEF DESCRIPTION OF THE DRAWINGS

FIGS. 1A and 1B illustrate cross-sectional views of a dual-stripline, in accordance with an embodiment of the present disclosure.

EMBODIMENTS OF THE PRESENT DISCLOSURE

Described herein are electronic structures that include a dual-stripline with crosstalk cancellation, in accordance with various embodiments. In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

As noted above, conventional or state-of-the-art stripline routing architectures are not able to scale to match the market demands for increased signaling rates and routing density. Particularly, as the signaling rate exceeds 10 GT/s, conventional dual-stripline routing is no longer an effective solution due to increased cross-talk between signal lines. Accordingly, embodiments disclosed herein include a routing architecture that includes dual-striplines with crosstalk cancellation. Embodiments can include a misregistration-independent dual-stripline structure with crosstalk cancellation. Embodiments can include a low-cost high-density dual-stripline with misregistration-independent crosstalk cancellation. In some embodiments, a dual-stripline with crosstalk cancellation provides improved mitigation of crosstalk and allows for improved data rates, (e.g., 10 GT/s or greater).

To provide context, on-package and on-board, and potentially on-Silicon (e.g., MCM-D package) dual-stripline routing may be desirable since it offers compact high-density routing requiring less real-estate and interconnect layer count reduction. However, this topology can suffer from high-crosstalk due to broadside coupling of overlapping striplines. As a result, the two striplines routed on two different layers need to be separated by a thick dielectric. Typically, a minimum stripline to stripline (layer-to-layer)

separation of 3X (see X in FIG. 1A) is used, while 4X is recommended, where X is the distance between the stripline signal to an adjacent reference plane. Even with such an approach the crosstalk issue can remain, particularly for short routing since the aggressor noise is less attenuated.

Figure 4:
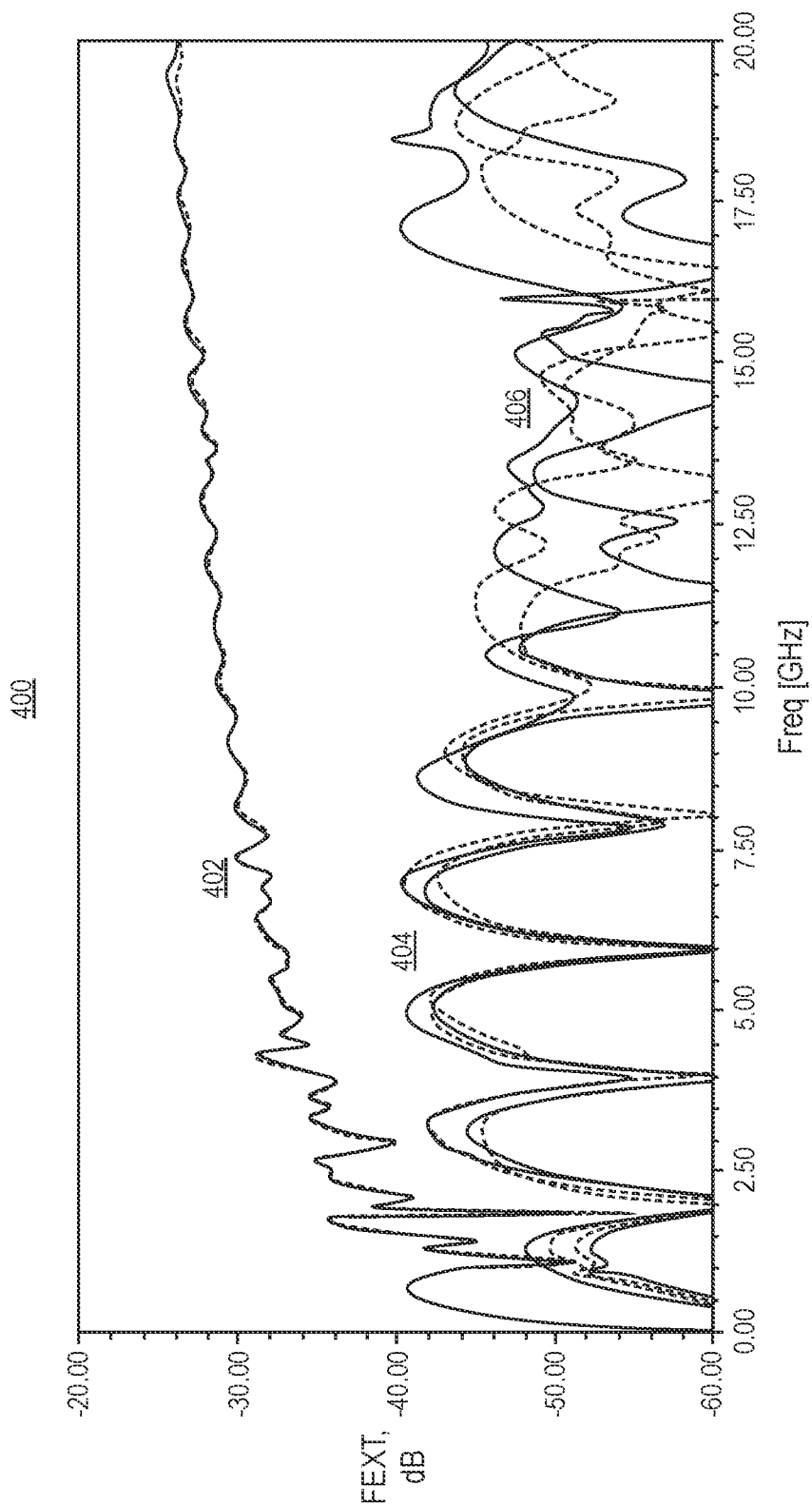
FIG. 4 is a plot of crosstalk (FEXT) as a function of frequency, in accordance with an embodiment of the present disclosure.

Embodiments described herein can include a dual-stripline (DSL) structure that can be implemented to solve DSL broadside noise coupling issues without the requirement of setting signal to signal distance (Y in FIG. 1A) to 3X, where X is shown in FIG. 1A, or 4× separation between the dual-stripline as well as other routing requirements to minimize crosstalk (FEXT). Embodiments can include for example (not necessarily) 1.25X separation, or even 1X separation and can be smaller than 1X, with up to more than 20 dB FEXT reduction compared to conventional DSL routing. Additionally, DSL architectures described herein can be implemented to solve an FEXT increase due to printed circuit board PCB misregistration. PCB misregistration can occur when, due to manufacturing variation, traces on one layer are shifted with respect to the adjacent layers. In the conventional DSL, such a shift can increase FEXT considerably. By contrast, DSLs described in accordance with embodiments described herein provide a FEXT comparable or better than a DSL with perfect alignment.

To provide further context, one solution to high-crosstalk due to broadside coupling is the use of thick dielectric between the two striplines (3× minimum, and 4× recommended, as described above) in addition to the use of zigzag and angled routing between one stripline and another on a different layer. The thick dielectric requirement can render the package or board unnecessarily thick and, as a result, it may be difficult to achieve a package or board thickness requirement. The zig-zag routing can take up more space compared to a situation where the DSL fully overlaps (e.g., as described below in association with the first aspect of this disclosure). An alternative routing solution is to use single-stripline to fully isolate one stripline layer from another with an extra ground plane. However, the use of single-stripline increases cost and reduces routing density since it requires more layers.

In a first aspect, a misregistration-independent dual-stripline structure with crosstalk cancellation is disclosed.

One or more embodiments described herein are directed to an overlapping differential dual-stripline structure that allows crosstalk cancellation without requiring a thick dielectric between the two stripline layers. The crosstalk cancellation can be achieved through symmetrical routing at a uniform section of the striplines and at a transition region where the p and n routing of one stripline is swapped.

Advantages of implementing embodiments disclosed herein include a wide applicability for Data Center, IoT, Silicon and CPU packages as well as rigid and flex printed circuit boards (PCBs) that increasingly require high-density routing for a given specification of package, silicon or board thickness and routing real estate. Applications include situations where a conventional DSL cannot be used due to the thick dielectric required between the two stripline layers. Embodiments disclosed herein allow for higher-density routing and less board thickness and real-estate achieved through fully overlapping dual-stripline without requiring 3× and 4× distance applicable to package, silicon and board routing.

In an embodiment, noise cancellation is achieved in a symmetrical differential transmission line structure such as two differential striplines. As an example, FIGS. 1A and 1B illustrate cross-sectional views 100 and 150, respectively, of a dual-stripline, in accordance with an embodiment of the present disclosure.

The differential striplines shown in the cross section in FIG. 1A used in this example are routed in a dielectric 106 with εr of 4.4 and tan δ of 0.01. The distance between the differential stripline Top_p 108 and Top_n 110 to the top ground or reference plane 102, and Bottom_p 112 and Bottom_n 114 to the bottom ground or reference plane 104 is, for example, 4 mils. The top and bottom striplines are separated by a, for example, 5-mil thick dielectric. To minimize crosstalk in a conventional DSL, the thickness needs to be at least 12 mils, while 20 mils is recommended. Accordingly, in an embodiment, the layer thickness requirement is reduced by more than half. In one embodiment, the trace width and spacing of the striplines are, for example, 3.5 mils and, for example, 8 mils, respectively to achieve a, for example, 85-Ohm differential impedance, as shown in FIG. 1B.

Figure 2:
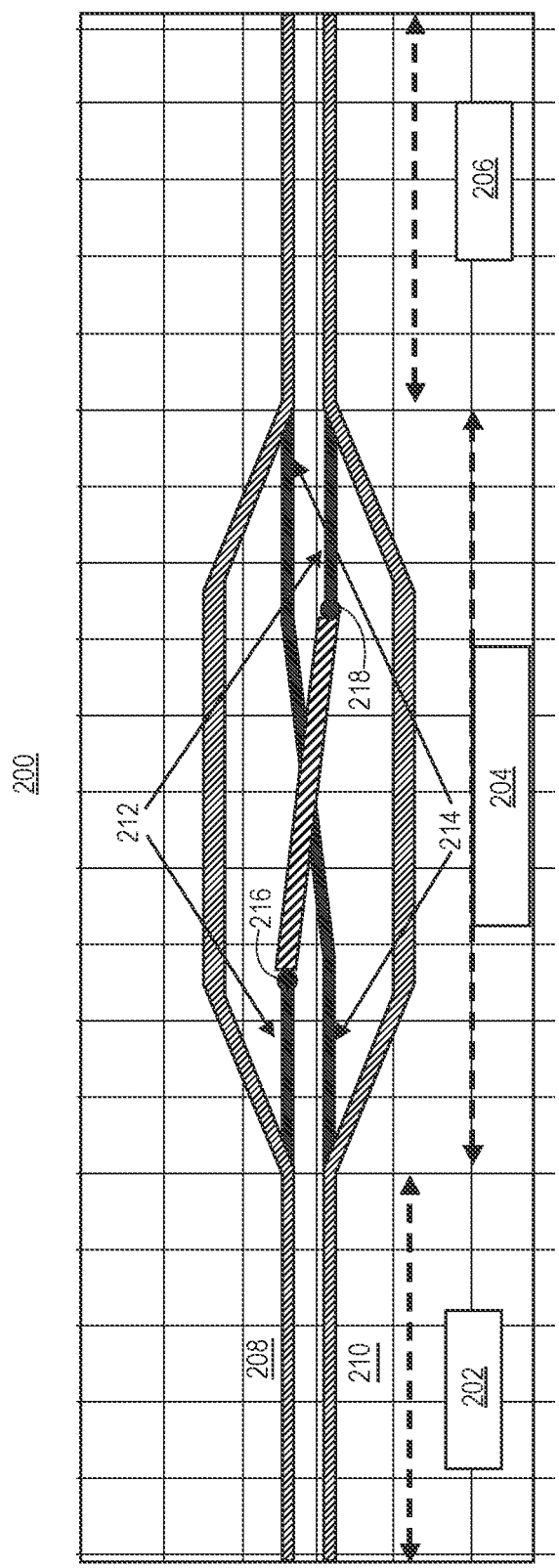
FIG. 2 illustrates a top view of a dual-stripline, in accordance with an embodiment of the present disclosure.

In accordance with one or more embodiments, a top view 200 of the DSL structures of FIGS. 1A and 1B is shown in FIG. 2. The routing is divided into three regions: a Region 1 (202), a Transition Region (204), and a Region 2 (206). In Region 1 (202), Top_p (208) overlaps Bottom_p (212) not shown in Region 1 (202). In the Transition Region (204), Bottom_p (212) and n (214) are swapped such that in Region 2 (206), Top_p (208) now overlaps Bottom_n (214), and Top_n (210) overlaps Bottom_p (212). The Bottom_p (212) stripline transition is achieved through via connections 216 and 218 to the top layer to move Bottom_p (212) from under Top_p (208) in Region 1 (202) to under Top_n (210) in Region 2 (206). Likewise, Bottom_n (214) routing transitions from overlapping Top_n (210) in Region 1 (202) to overlapping Top_p (208) in Region 2 (206), except in this case there is no via transition.

With reference again to FIG. 2, in accordance with an embodiment of the present disclosure, a printed circuit board (PCB), a package substrate or a semiconductor die includes a dual-stripline structure 200. The dual-stripline structure 200 includes a first region 202 including a first top line 208 vertically over a first bottom line 212, and a second top line 210 vertically over a second bottom line 214. The dual-stripline structure 200 also includes a second region 206 including the first top line 208 vertically over the second bottom line 214, and the second top line 210 vertically over the first bottom line 212. The dual-stripline structure 200 also includes a transition region 204 between the first region 202 and the second region 2026. The first bottom line 212 and the second bottom line 214 cross in the transition region 204 without causing electrical short circuit.

With reference again to FIG. 2, in one embodiment, in the case of a package substrate, a package substrate includes a plurality of alternating organic dielectric layers and metal layers. A dual-stripline structure is in the plurality of alternating organic dielectric layers and metal layers. With reference again to FIG. 2, in one embodiment, in the case of a semiconductor die, a semiconductor die includes a semiconductor substrate. A plurality of alternating dielectric layers and metal layers is above the semiconductor substrate. A dual-stripline structure in the plurality of alternating dielectric layers and metal layers.

In one embodiment, the first bottom line 212 crosses over the second bottom line 214 in the transition region 204 using a first via 216 and a second via 218, the first via 216 raising the first bottom line 212 from a plane of the second bottom line 214 to a plane of the first top line 208 and the second top line 210, and the second via 218 lowering the first bottom line 212 from the plane of the first top line 208 and the second top line 210 to the plane of the second bottom line 214. In one embodiment, the printed circuit board (PCB), the package substrate, or the semiconductor die further includes a ground plane beneath the dual-stripline structure 200. The ground plane does not include a void beneath the transition region. In one embodiment, the first top line 208 and the second top line 210 are spaced further apart from one another in the transition region 204 than in the first region 202 and in the second region 206.

In one embodiment, in a case where bottom_p and n are the victim stripline receiving noise from the Top_p and Top_n, analysis of how the far-end-crosstalk is cancelled as the noise signal from Top_p and Top_n propagates from input (left-end of Region 1) to output (right-end of Region 2) can be performed. In particular, the length of Region 1 and 2 is equal so the amount of noise coupled to Bottom_p from Top_p in Region 1 is, for example, equal to the amount of noise coupled to Bottom_p from Top_n in Region 2. Since Top_p and Top_n are differential signals and therefore their amplitude is equal and opposite polarity, the cumulative noise coupled to Bottom_p from Top_p and Top_n cancels out. The same applied the noise coupled to Bottom_n from Top_n and p.

In an embodiment, more practically, the noise signal coupled from Top_p and Top_n to Bottom_p and Bottom_n is attenuated slightly as it propagates from Region 1 and 2. As a result, the noise coupling in Region 1 can be slightly stronger than that in Region 2. To overcome such a noise coupling imbalance, in one embodiment, the length of Region 2 can be extended to balance the coupling in Region 1.

In an embodiment, to apply the same principle of noise cancellation in the Transition Region, the routing in this region is made as symmetrical as possible, although perfect symmetry is not possible since bottom_p and n have to cross. Therefore, in this case, Bottom_p has to transition to the same layer as that of Top_p and Top_n before returning to the bottom layer. Nonetheless, due to the symmetrical transition from Bottom_p to via to Bottom_p on the top-layer and back to the bottom layer through another via, Bottom_p routing in the Transition Region also receives an equal magnitude of noise with opposite polarity from Top_p and n, respectively. Therefore, in a particular embodiment, the cumulative noise to Bottom_p in the Transition Region from Top_p and Top_n cancels out. The same cancellation can also occurs on the Bottom_n in the Transition Region.

In an embodiment, although both do not change a layer, the Top_p and n in the Transition Region are separated with wider spacing to accommodate clearance from the vias used in Bottom_p transition. In a particular such embodiment, to maintain for example 85-Ohm differential impedance in this region, the trace width of Top_p and Top_n has to be widened to, for example, 5.5 mils.

Figure 3:
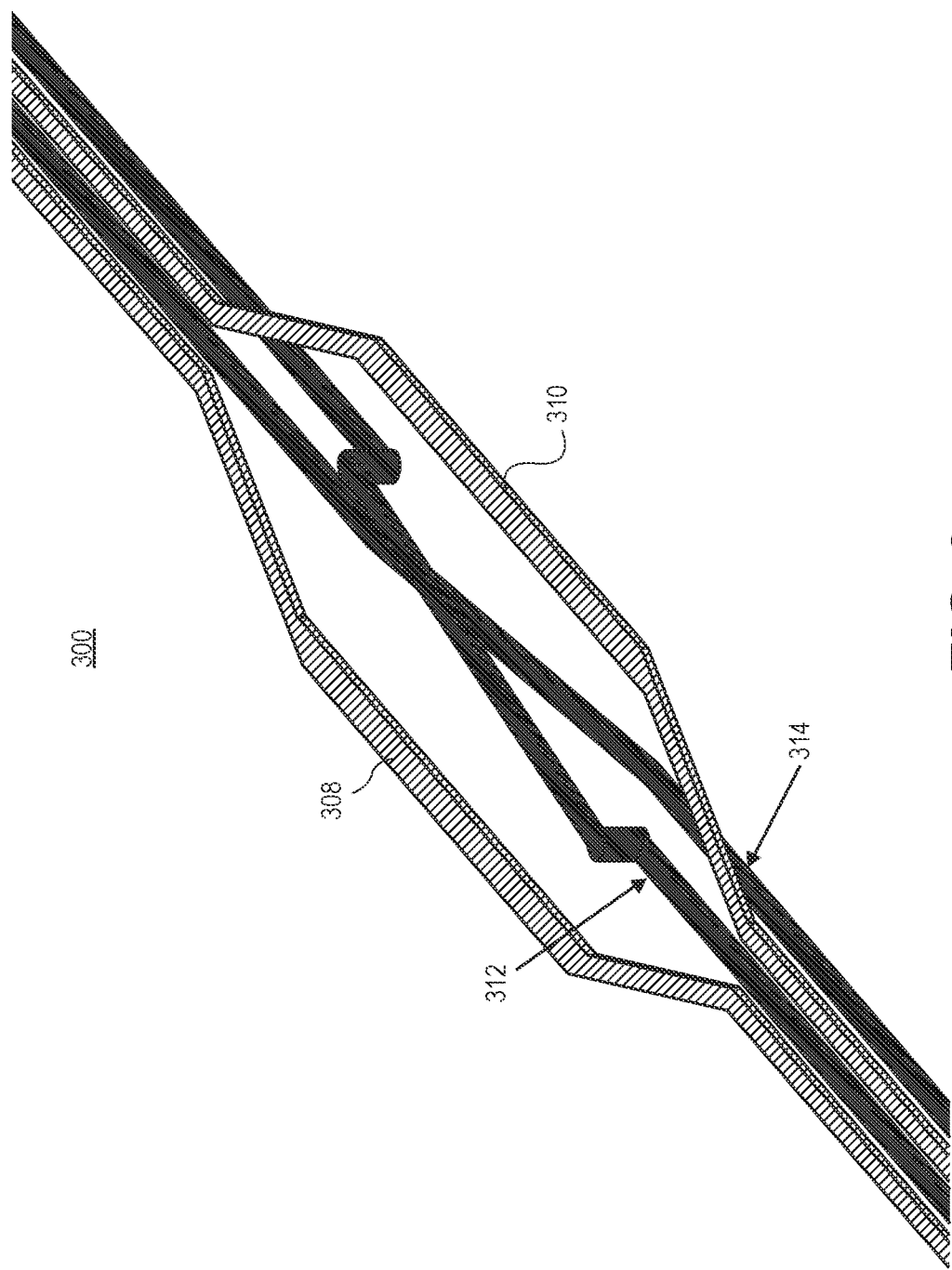
FIG. 3 illustrates a three-dimensional view of a dual-stripline, in accordance with an embodiment of the present disclosure.

FIG. 3 illustrates a three-dimensional view 300 view of Region 1, Transition Region and Region 2, showing Top_p 308, Top_p 310, Bottom_p 312, and Bottom_n 314. In one embodiment, the via transition for Bottom_p 312 is implemented using a, for example, 4-mil diameter via. In one embodiment, the overall length of the DSL is, for example, 3 inches where the length of Region 1 and 2 is for example 1.4 inches and the length of the transition region is for example 0.2 inches. To demonstrate the crosstalk benefit of DSL-with-cancellation, a conventional DSL (called DSL-no-cancellation) having the exact same trace dimensions, spacing and dielectric properties as DSL-with-cancellation shown in FIGS. 1A and 1B with the difference that in the conventional DSL, Bottom-p and Bottom_n fully overlap Top_p and Top_n, respectively for the entire length which is the same length as DSL-with-cancellation of for example 3 inches. It is to be appreciated that the above exemplary parameters are, in one embodiment, applicable to printed circuit board (PCB). The parameters for package and semiconductor dies can be much smaller, e.g., on the order of microns. It is also to be appreciated that the electrical performance of described herein can be independent of manufacturing variation during which top p and n are shifted with respect to bottom p and n.

In an embodiment, as shown in plot 400 of FIG. 4, DSL-with-cancellation 404 exhibits less FEXT by up-to more than 20 dB from DC to 20 GHz (compare DSL-no-cancellation 404 versus DSL-with-cancellation 404). The FEXT reduction is more pronounced at higher frequencies which is beneficial for higher-data rate transmissions. In an embodiment, less than −40 dB FEXT, or less than 1% noise energy coupling, can be achieved with DSL-with-cancellation 404 from DC to 20 GHz. In FIG. 4, the effect of PCB misregistration is also included, where the Top_p and Top_n traces are shifted by, for example, 2 mils with respect to Bottom_p and Bottom_n which is a typical range of HVM misregistration. The FEXT due to PCB misregistration 406 is comparable or better than the FEXT of perfectly aligned DSL.

Figure 5:
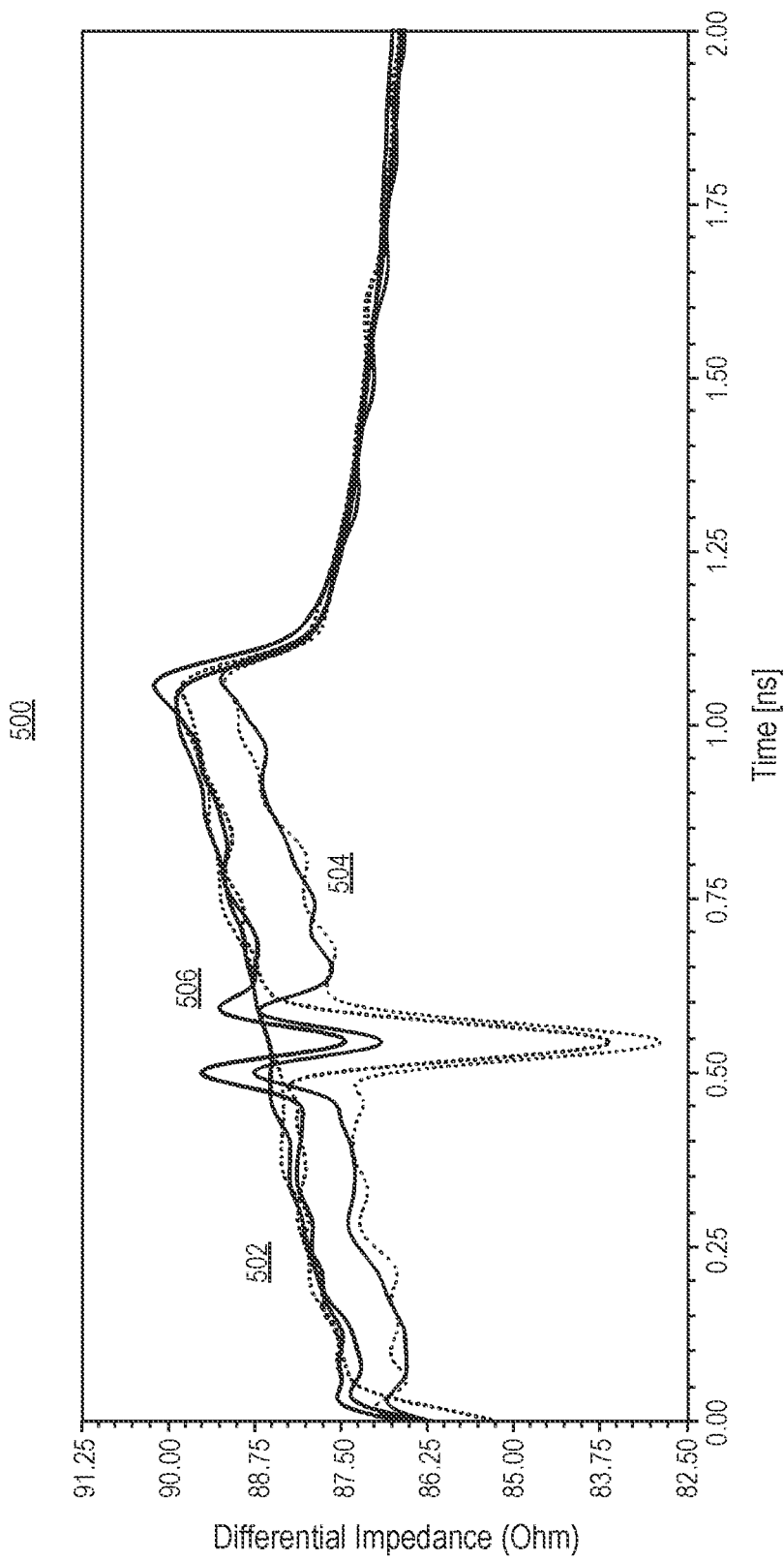
FIG. 5 is a plot of differential impedance as a function of time, in accordance with an embodiment of the present disclosure.
Figure 6:
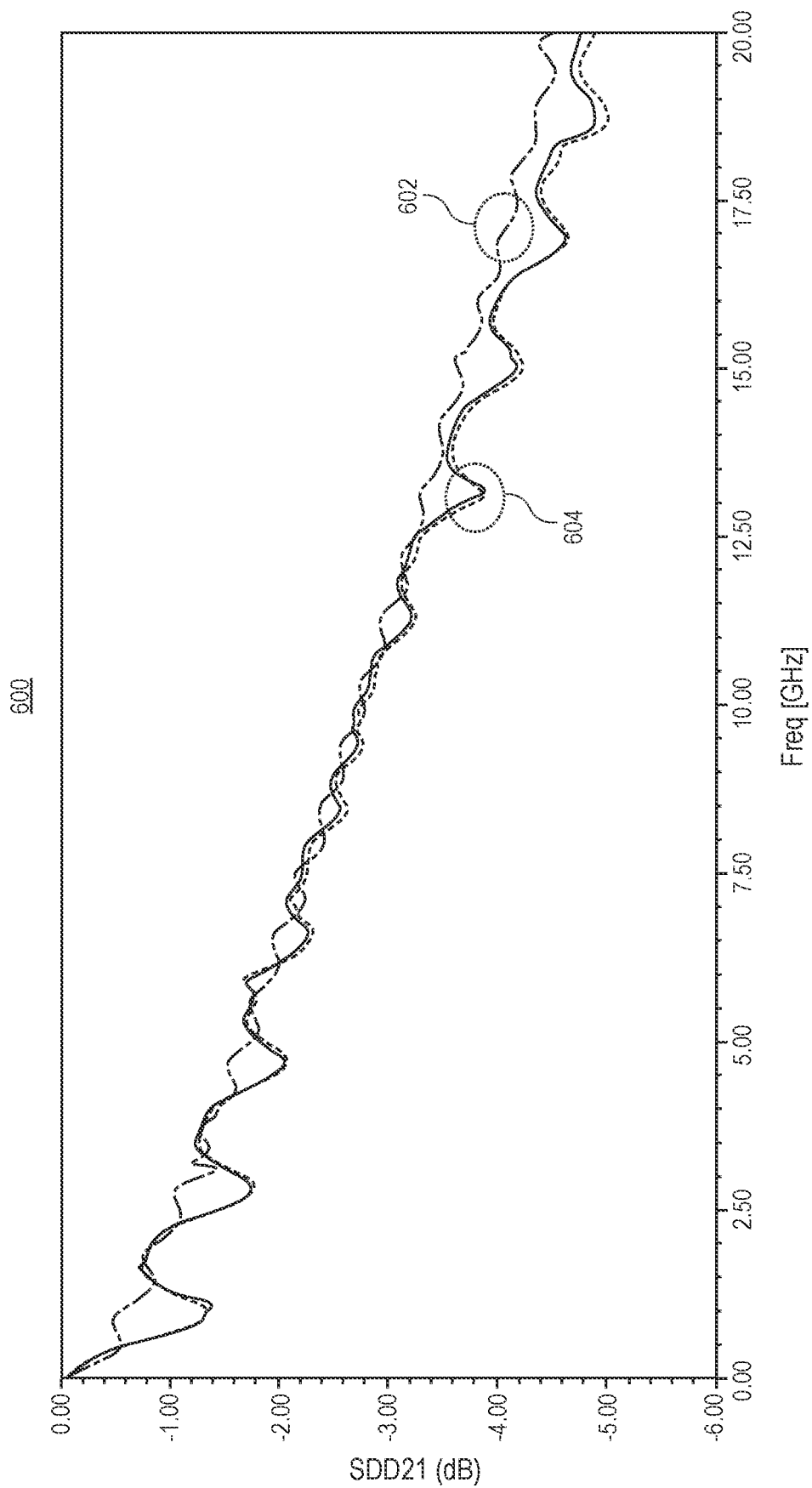
FIG. 6 is a plot of crosstalk (dB) as a function of frequency, in accordance with an embodiment of the present disclosure.

FIGS. 5 and 6 are plots 500 and 600, respectively, showing the impedance and insertion loss of DSL-with-cancellation 504 and DSL-no-cancellation 502, respectively to determine the impact of the Transition Region. The transition region where the trace is widened for Top_p and Top_n results in less than, for example, 3-Ohm impedance discontinuity, as shown in the fan-out-section in FIG. 5. The via transition on the Bottom_p trace causes less than 5-Ohm of impedance discontinuity. Both impedance discontinuities observed are less than 10% typical impedance tolerance. Due to longer traces for both Top and bottom DSL of DSL-with-cancellation 504, a slightly higher insertion loss can be expected. In FIG. 6, the insertion increase is less than 0.5 dB attributed to the Transition Region. The insertion loss difference is independent on the length of Region 1 and 2 since the length in these regions is the same for DSL-with-cancellation 604 and DSL-no-cancellation 602. FIG. 5 also shows that DSL impedance change is minimal as a result of printed circuit board PCB misregistration (506).

In a second aspect, a low-cost high-density dual-stripline with misregistration-independent crosstalk cancellation is disclosed.

Embodiments of described below may differ from embodiments described above in that a low-cost implementation can be achieved with or without the need for expensive vias. Embodiments can enable higher density routing.

One or more embodiments described herein are directed to a fully-overlapping differential dual-stripline structure that enables crosstalk cancellation without requiring a thick dielectric between the two stripline layers. The crosstalk cancellation can be achieved through p and n-pin swap on one of the striplines where the swap is implemented through micro-via or skip-via transition to a voided ground layer. The swap can also be implemented on the signal layer without requiring a void on the ground layer.

Advantages of implementing embodiments disclosed herein include a wide applicability for Data Center, IoT, and CPU packages, PCB and semiconductor dies that increasingly require high-density routing. Embodiments can be implemented to enable low-cost higher-density routing and less board, package and semiconductor substrate thickness and real-estate achieved through a fully overlapping dual-stripline without requiring a thick dielectric between the two stripline pairs. Embodiments may be particularly applicable to high-speed routing. State-of-the-art packages implement single-stripline routing for high-speed I/O FIG. 7B; by contrast, embodiments can be implemented to reduce a package layer count from four to three for every two stripline layers. In addition, the routing density defined by signal-to-ground ratio can increase from 0.67 to 1. Accordingly, in one embodiment, in a case of eight stripline routing layers on the package substrate, embodiments can be implemented to enable layer count reduction of four layers which reduces package fabrication cost and increases routing density.

Figure 7A:
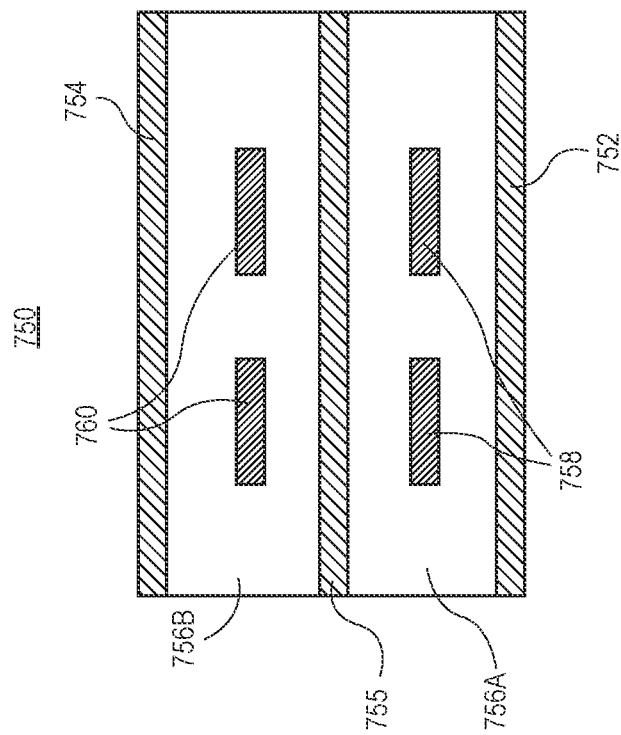
FIG. 7A illustrates a cross-sectional view of a stripline, in accordance with an embodiment of the present disclosure.
Figure 7B:
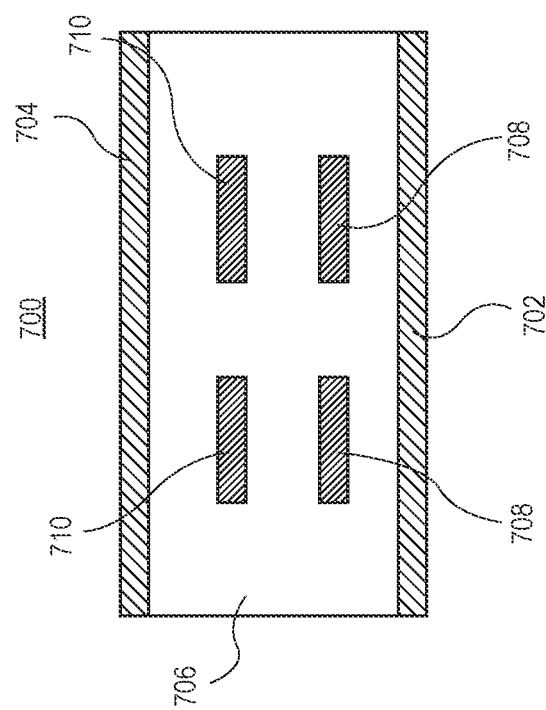
FIG. 7B illustrates a cross-sectional view of a state-of-the-art stripline.

As an exemplary comparison, FIG. 7A illustrates a cross-sectional view of a stripline 700, in accordance with an embodiment of the present disclosure. FIG. 7B illustrates a cross-sectional view of a state-of-the-art stripline 750.

Referring to FIG. 7A, stripline 700 includes a lower ground layer 702 and an upper ground layer 704. A dielectric 706 between the lower ground layer 702 and the upper ground layer 704 includes a lower signal layer 708 and an upper signal layer 710. The stripline 700 thus has three build-up layers, two ground layers, and two signal layers, for a 1:1 signal to ground ratio.

Referring to FIG. 7B, stripline 750 includes a lower ground layer 752, a middle ground layer 755 and an upper ground layer 754. A lower dielectric 756A and an upper dielectric 756B are between the lower ground layer 752 and the upper ground layer 754 includes a lower signal layer 758 and an upper signal layer 760. The stripline 750 thus has four build-up layers, three ground layers, and two signal layers, for a 1:1.5 or 0.67:1 signal to ground ratio. It is to be appreciated that the higher this number the higher the routing density is and, therefore, more desirable.

Unlike embodiments described in association with the first aspect, where the Top_p and n in the Transition Region contain a fan-out section and can be separated with wider spacing to accommodate clearance from the vias used in Bottom_p transition, embodiments in the second aspect do not have such a transition. That is, the Top_p and n are continuous throughout the structure from Region 1 to Region 2. This feature can provide a benefit of smoother impedance discontinuity (TDR) as compared to earlier embodiments.

Figure 8:
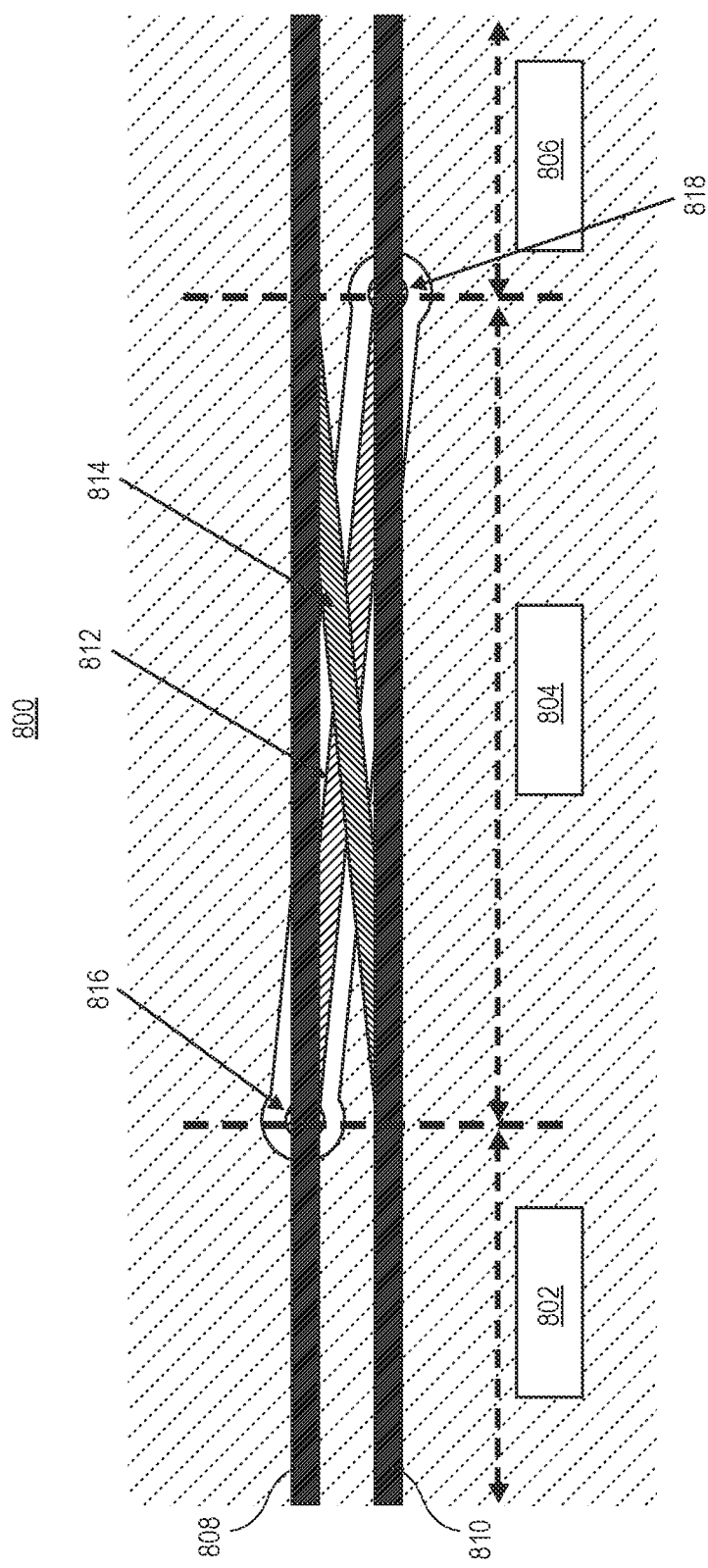
FIG. 8 illustrates a top-view of a dual-stripline, in accordance with an embodiment of the present disclosure.

FIG. 8 illustrates a top-view of a dual-stripline 800, in accordance with an embodiment of the present disclosure. The dual-stripline 800 has a Region 1 (802), a transition region 804, and a Region 2 (806). The dual-stripline 800 includes a Top_p (808), aTop_n (810), a Bottom_p (812), a Bottom_n (814), a skip via 816 and a skip via 818. The transition region 804 can be implemented using a skip via (such as used in a PCB process) or a micro-via (such as in a package and PCB process).

With reference again to FIG. 8, in accordance with an embodiment of the present disclosure, a printed circuit board (PCB), a package substrate or a semiconductor die includes a dual-stripline structure 800. The dual-stripline structure 800 includes a first region 802 including a first top line 808 vertically over a first bottom line 812, and a second top line 810 vertically over a second bottom line 814. The dual-stripline structure 800 also includes a second region 806 including the first top line 808 vertically over the second bottom line 814, and the second top line 810 vertically over the first bottom line 812. The dual-stripline structure 800 also includes a transition region 804 between the first region 802 and the second region 806. The first bottom line 812 and the second bottom line 814 cross in the transition region 804 without causing electrical short circuit.

With reference again to FIG. 8, in one embodiment, in the case of a package substrate, a package substrate includes a plurality of alternating organic dielectric layers and metal layers. A dual-stripline structure is in the plurality of alternating organic dielectric layers and metal layers. With reference again to FIG. 8, in one embodiment, in the case of a semiconductor die, a semiconductor die includes a semiconductor substrate. A plurality of alternating dielectric layers and metal layers is above the semiconductor substrate. A dual-stripline structure in the plurality of alternating dielectric layers and metal layers.

In one embodiment, the first bottom line 812 crosses below the second bottom line 814 in the transition region 804 using a first via 816 and a second via 818, the first via 816 lowering the first bottom line 812 from a plane of the second bottom line 814 to a lower plane, and the second via 818 raising the first bottom line 812 from the lower plane to the plane of the second bottom line 814. In one embodiment, referring to FIG. 9 described below, the printed circuit board (PCB), the package substrate or the semiconductor die further includes a ground plane 902 beneath the dual-stripline structure 800. The ground plane 902 includes a void 904 beneath the transition region 804. In one embodiment, the lower plane is in the void 904. In one embodiment, the first top line 808 and the second top line 810 are spaced a same distance from one another in the transition region 804 as in the first region 802 and in the second region 806.

Figure 9:
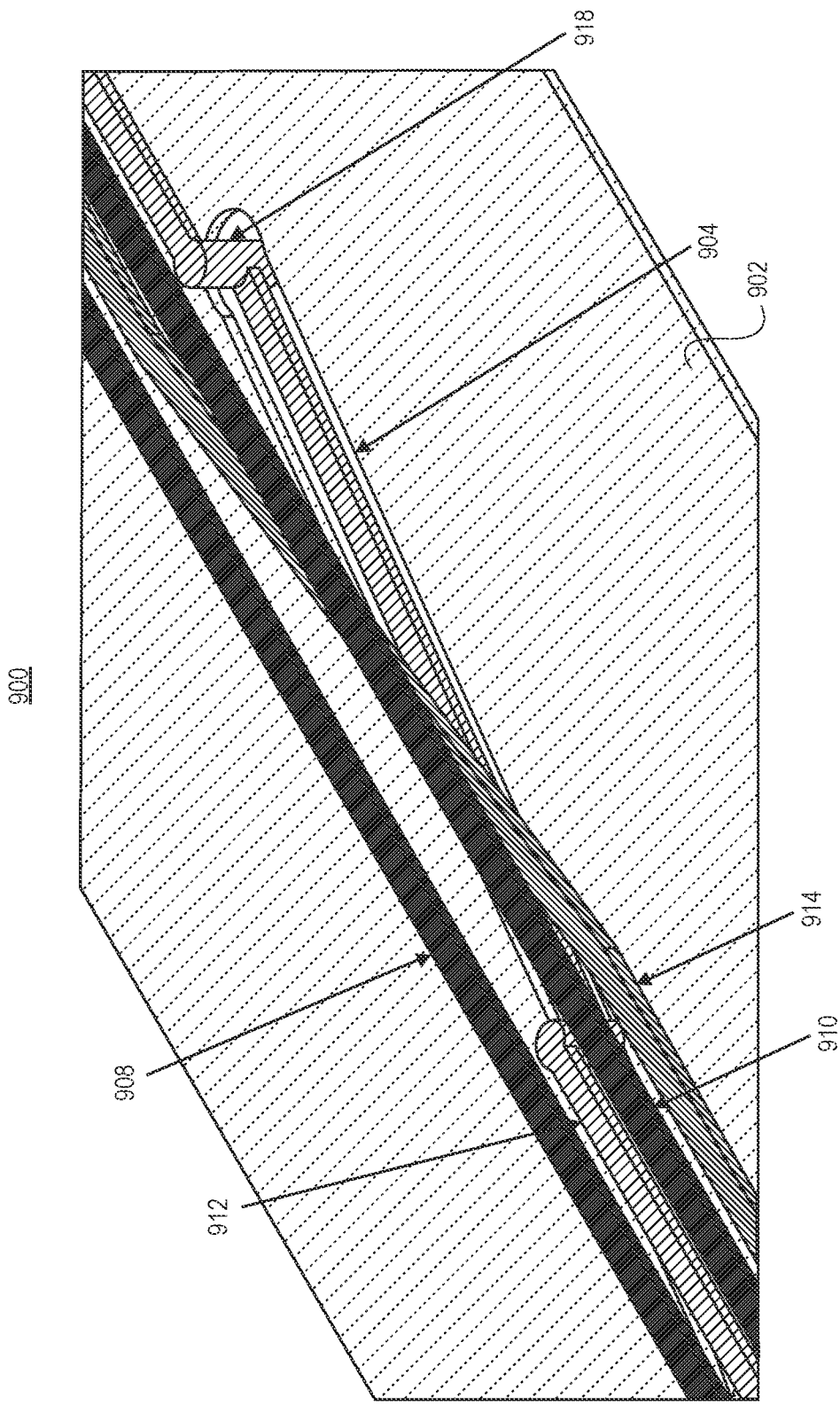
FIG. 9 illustrates a three-dimensional view of a dual-stripline, in accordance with an embodiment of the present disclosure.

FIG. 9 illustrates a three-dimensional view of a dual-stripline 900, in accordance with an embodiment of the present disclosure. The dual-stripline 900 includes a ground plane 902 having a void 904 therein. The dual-stripline 900 also includes a Top_p (908), aTop_n (910), a Bottom_p (912), a Bottom_n (914), and a skip via 918. In one embodiment, the via transition for Bottom_p (912) can be implemented using a, for example, 5-mil diameter skip via. A skip via can be implemented using a low-cost high-volume process which may be much lower-cost than an HDI or micro via used in embodiments described in the first aspect. However, it is to be appreciated that the use of such vias can apply to this embodiment.

Figure 10:
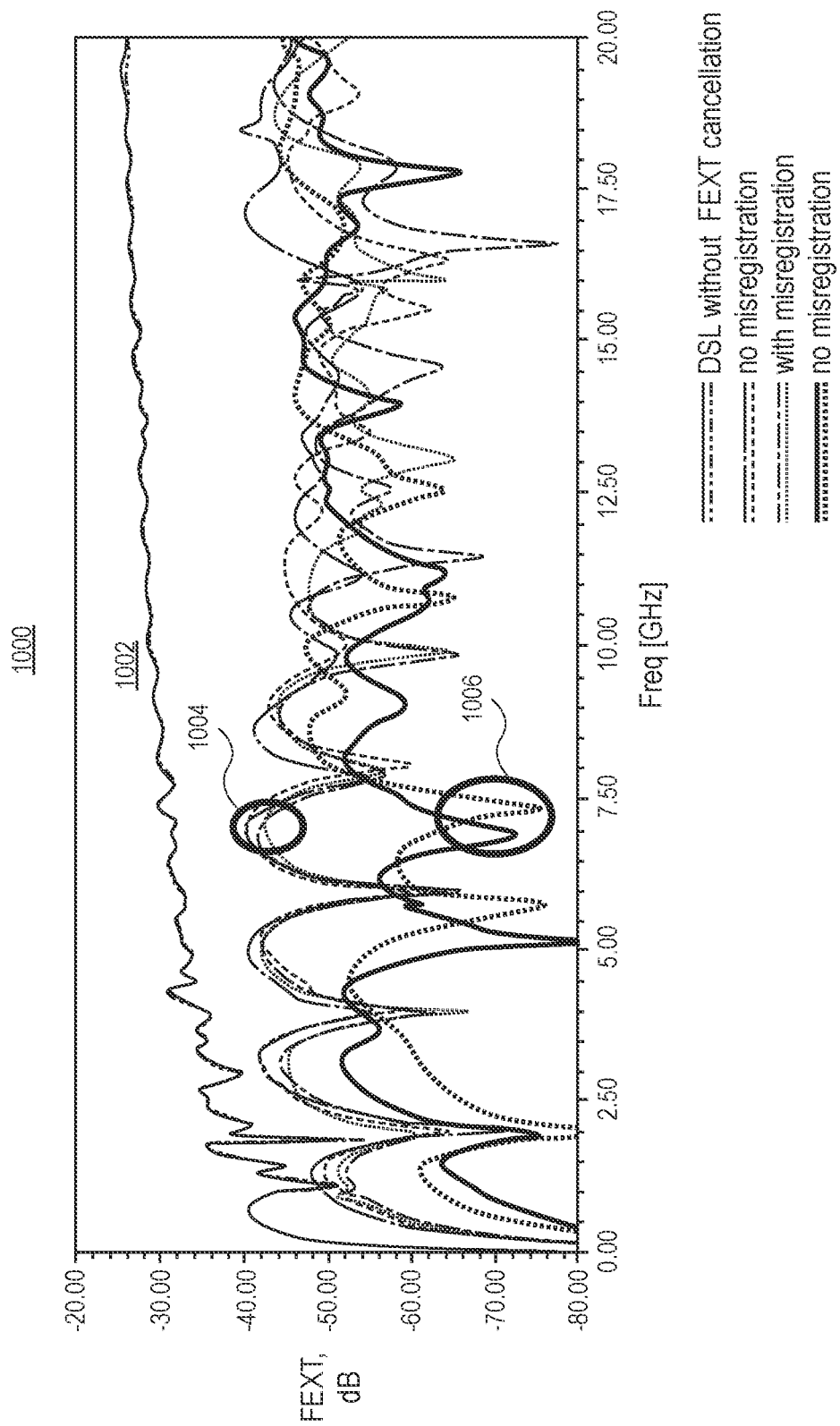
FIG. 10 is a plot of crosstalk (FEXT) as a function of frequency, in accordance with an embodiment of the present disclosure.
Figure 11:
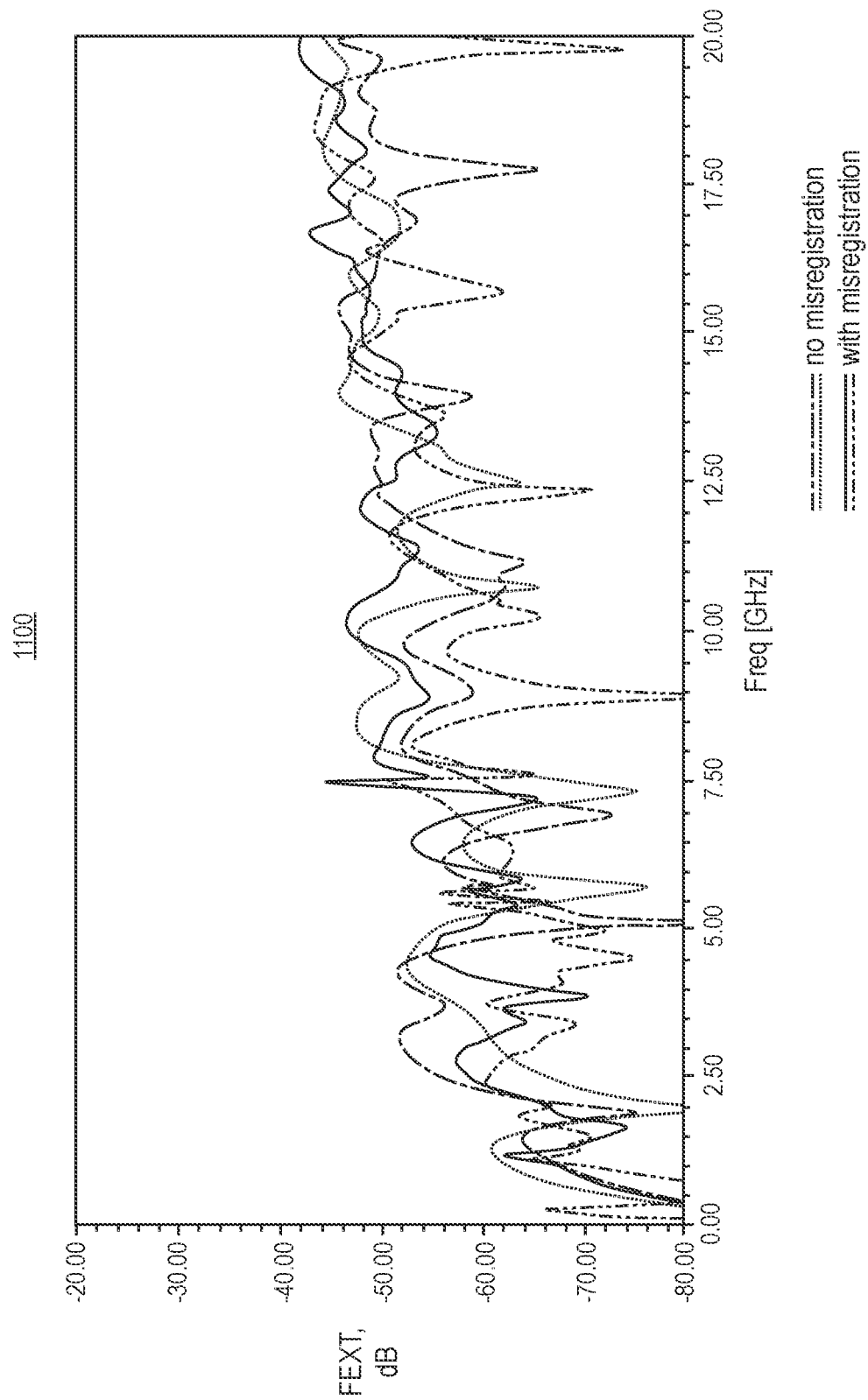
FIG. 11 is a plot of crosstalk (FEXT) as a function of frequency, in accordance with an embodiment of the present disclosure.

In an embodiment, FIG. 10 is a plot 1000 showing that a DSL (1006) of the second aspect of the present disclosure achieves even lower FEXT (e.g., by up to 10 dB) than a DSL (1004) of the first aspect of the present disclosure, and more than 20 dB than -DSL-no-cancellation (1002). In one embodiment, less than −50 dB FEXT or less than 0.5% noise energy coupling can be achieved for almost for the entire bandwidth from DC-20 GHz. In FIG. 11, a plot 1100 shows that misregistration does not have much impact to the FEXT as compared for FEXT with and without misregistration. The insertion loss impact is similar to that between embodiments from the first aspect in which 0.5 dB max increase is observed from DC to 20 GHz which translates to, for example, 0.17 dB/in.

Figure 12:
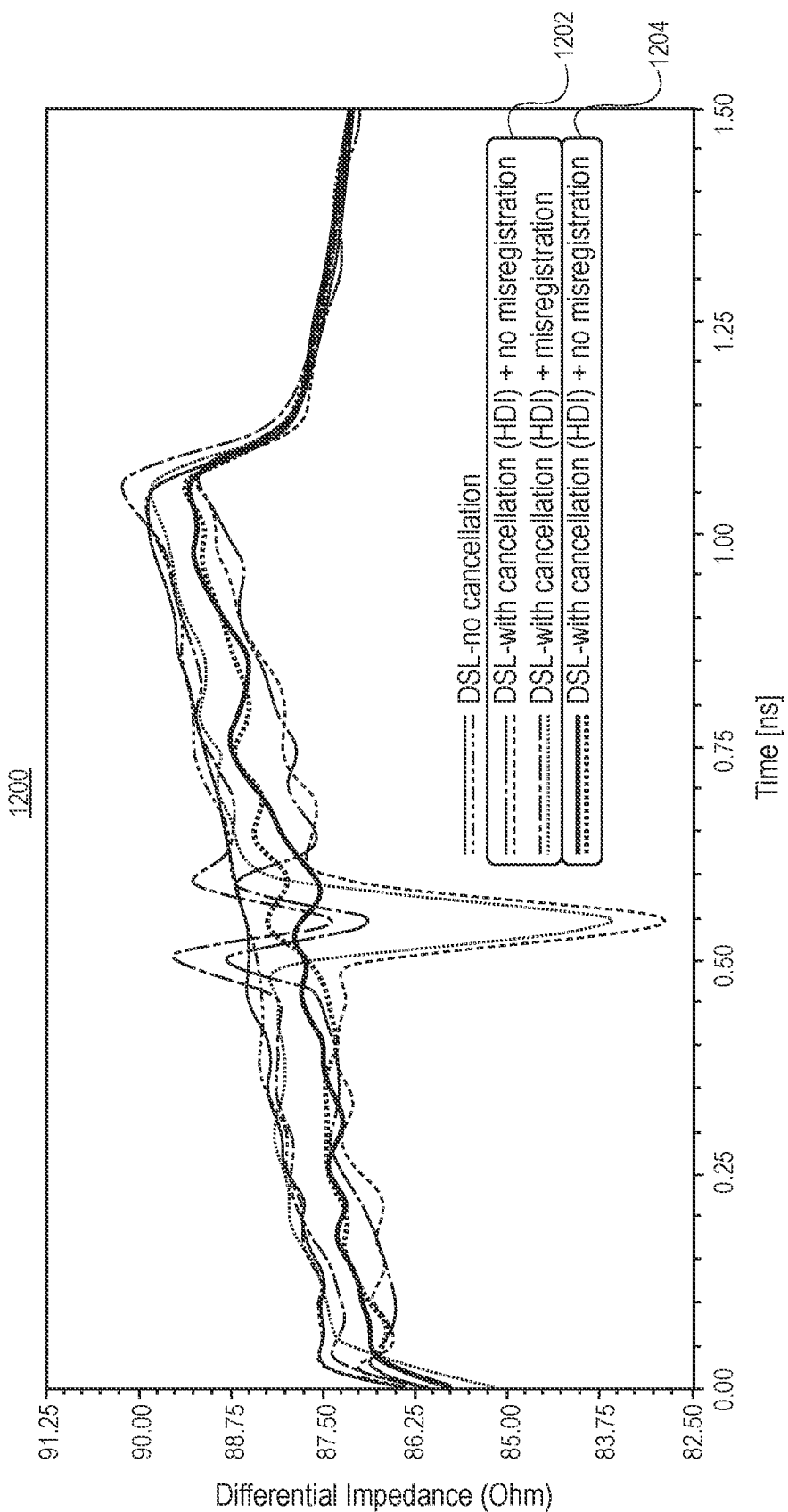
FIG. 12 is a plot of differential impedance as a function of time, in accordance with an embodiment of the present disclosure.
Figure 13:
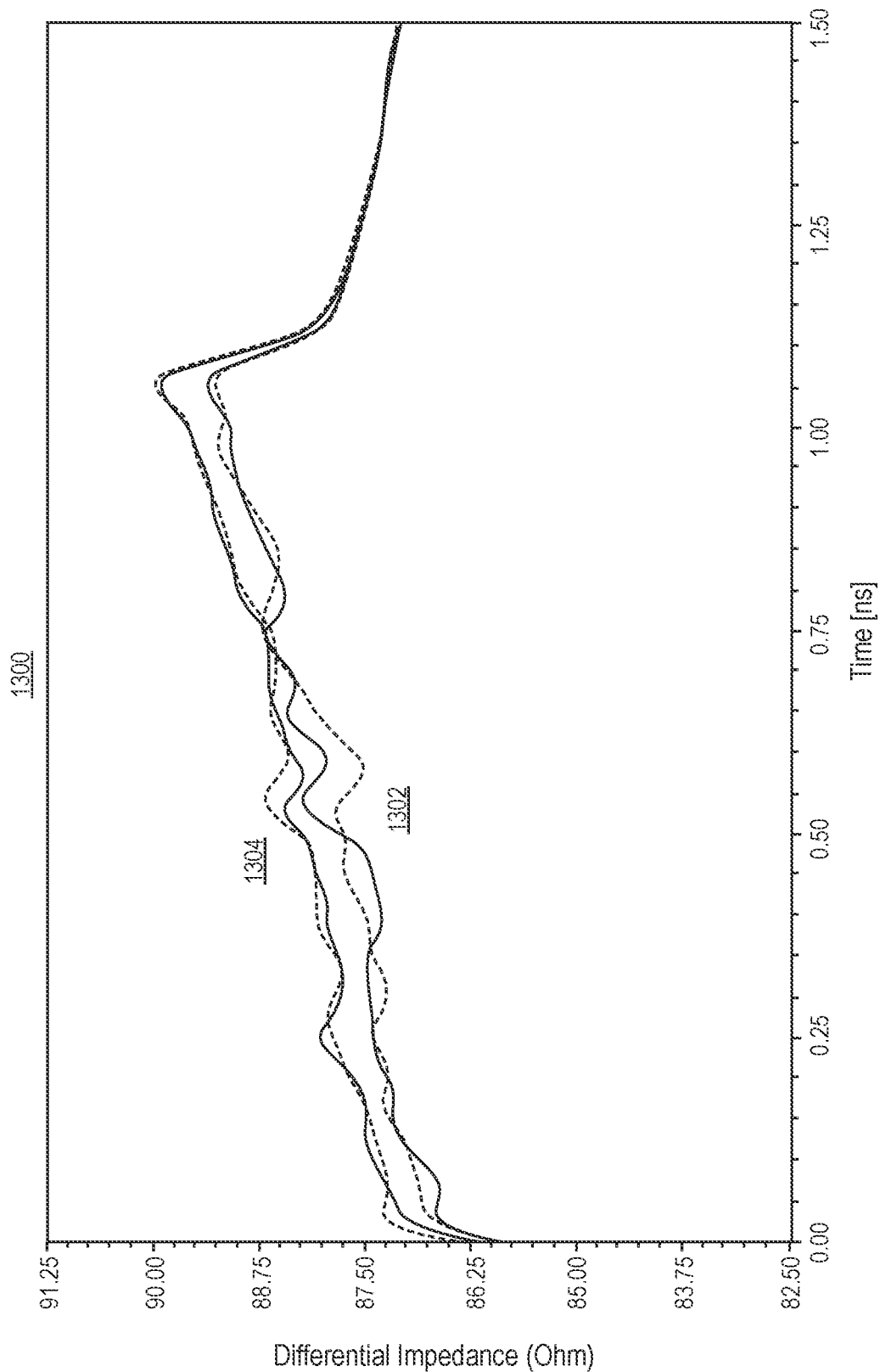
FIG. 13 is a plot of differential impedance as a function of time, in accordance with an embodiment of the present disclosure.

FIG. 12 is a plot 1200 showing the impedance of a DSL of the second aspect (1204) with DSL-no-cancellation (red plots) and with DSL of the first aspect (1202) to determine the impact of the Transition Region. A DSL of the second aspect barely exhibits any impedance discontinuity and its impedance profile is very close to a DSL-no-cancellation. In the TDR plot 1300 in FIG. 13, comparing the impedance of a DSL of the second aspect with (1304) and without misregistration (1302), the misregistration adds about 0.5-Ohm impedance.

Figure 14:
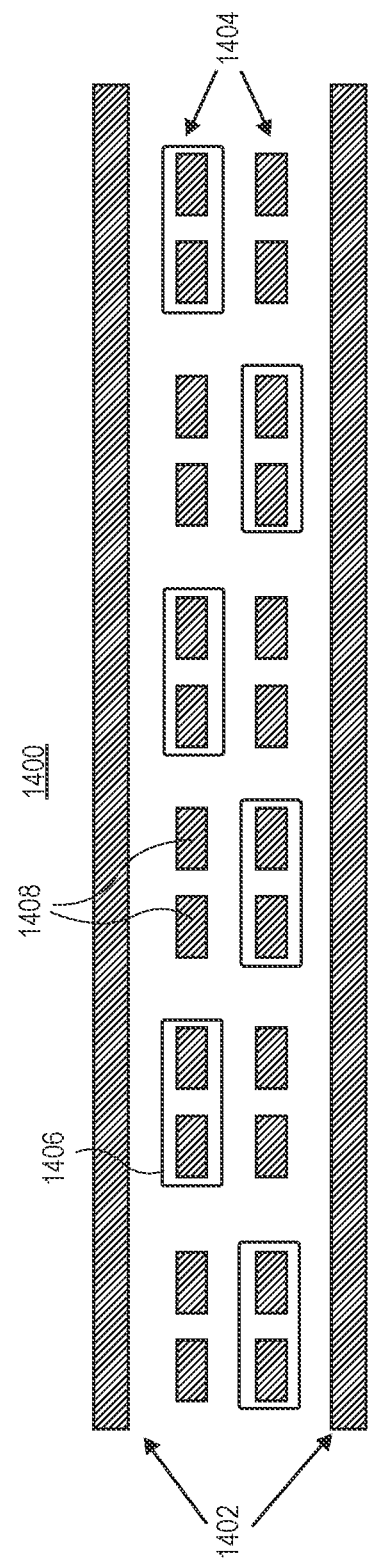
FIG. 14 illustrates a cross-sectional view of a differential dual-stripline array, in accordance with an embodiment of the present disclosure.

In a third aspect, FIG. 14 illustrates a cross-sectional view of a differential dual-stripline array, in accordance with an embodiment of the present disclosure.

Referring to FIG. 14, a differential dual-stripline array 1400 includes reference planes 1402 having differential dual-striplines 1404 there between. Dual-striplines 1404 can be implemented using 200 or 800. Alternating ones of the dual-striplines 1404 are swizzled dual-striplines 1406, and the others are non-swizzled dual-striplines 1408. The swizzled DSL and non-swizzled DSL are routed on alternating layers such that any swizzled DSL overlaps non-swizzled DSL and vice versa. The swizzled DSL is the same DSL configuration as described above with or without ground void (e.g., using 200 or 800 as a way to implement 1404 and/or 1406). The alternating DSL configuration allows both vertical and horizontal FEXT cancellation and allows the DSL on the same layers be brought even closer together thereby increasing routing density. In one embodiment, swizzled and non-swizzled DSL on alternating layers enables both vertical and horizontal crosstalk cancellation.

Accordingly, embodiments with a dual-stripline with crosstalk cancellation significantly reduce crosstalk without growing the silicon die, printed circuit board (PCB) and package area, and can utilize fewer routing layers. Such advantages provide significant costs savings.

Figure 15:
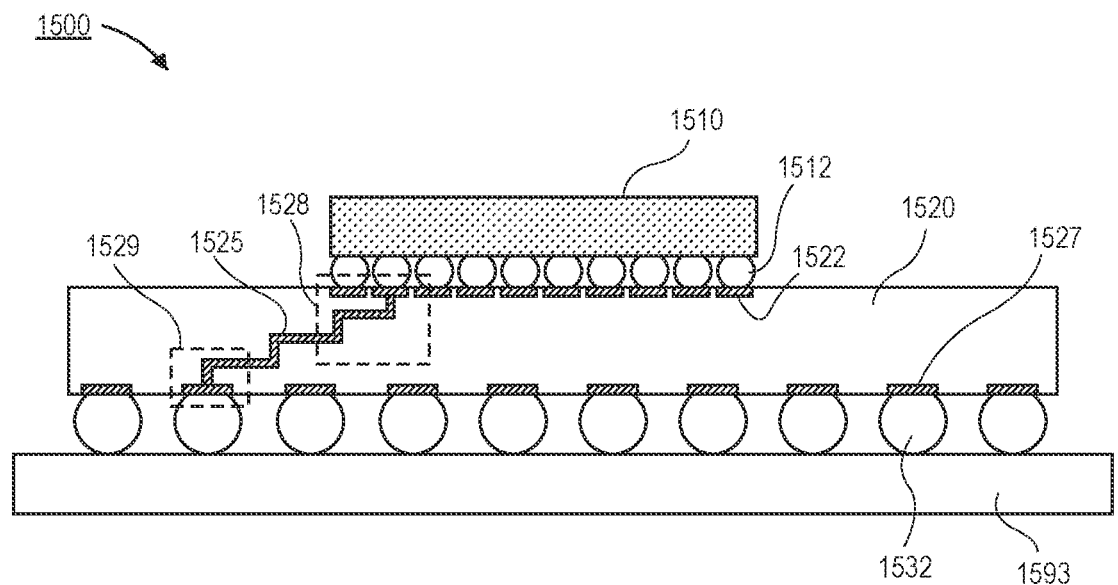
FIG. 15 is a cross-sectional illustration of an electronic structure that includes a dual-stripline with crosstalk cancellation, in accordance with an embodiment of the present disclosure.

Referring now to FIG. 15, a cross-sectional illustration of an electronic system 1500 is shown, in accordance with an embodiment. In an embodiment, the electronic system 1500 may include a board 1593, such as a printed circuit board (PCB). The board 1593 may be any suitable PCB as known in the art. In an embodiment, a package substrate 1520 may be coupled to the board 1593. The package substrate 1520 is shown as being coupled to the board 1593 with interconnects 1532. Interconnects 1532 are illustrated as solder bumps, but it is to be appreciated that any interconnect 1532 (e.g., pins or the like) may be used to couple the package substrate 1520 to the board 1593.

In an embodiment, a die 1510 is coupled to the package substrate 1520. The die 1510 may be any die including transistors or other circuitry including active or passive devices. The die 1510 may include silicon, III-V semiconductor materials, or any other semiconductor material. In a particular embodiment, the die 1510 may be a CPU or the like. In an embodiment, the die 1510 may be coupled to the package substrate 1520 with interconnects 1512. In a particular embodiment, the interconnects 1512 may include controlled collapse chip connection (C4) bumps.

In an embodiment, the package substrate 1520 may include routing 1525 that extends from pads 1522 on a first surface (i.e., a surface layer) of the package substrate 1520 to a pin pad 1527 on a second surface (i.e., a bottom layer) of the package substrate 1520. The routing 1525 may include vias, pads, and/or traces. The routing 1525 may include a conductive material (e.g., copper). The routing 1525 may include a single layer or multiple layers of more than one conductive material (e.g., barrier layers, or the like). In an embodiment, a first end of the routing 1525 may be in the bumpout region 1528 of the package substrate 1520 and a second end of the routing 1525 may be in the pin region 1529 of the package substrate 1520.

In an embodiment, the routing 1525, bumpout region 1528 and pin region 1529 may be a dual-stripline described in this disclosure for transmitting high-speed signals to and/or from the die 1510. In an embodiment, the routing 1525 may be a trace in a dual-stripline with crosstalk cancellation routing configuration. The routing 1525 may have significant cross-talk reduction compared to single-stripline routing. DSL described in this disclosure can be implemented on die 1510, interconnects 1520 and board 1593.

Figure 16:
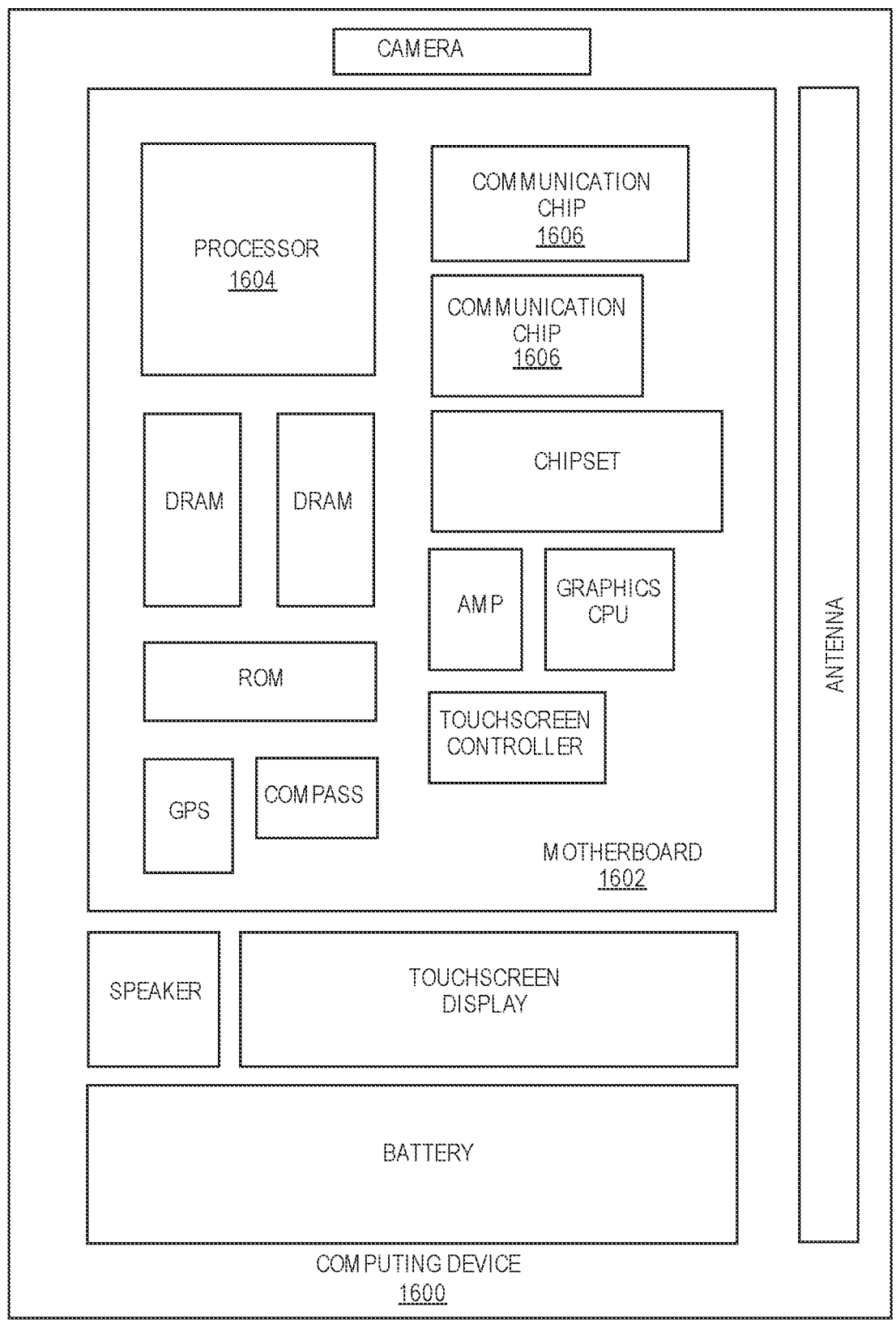
FIG. 16 is a schematic of a computing device built in accordance with an embodiment of the present disclosure.

FIG. 16 illustrates a computing device 1600 in accordance with one implementation of the disclosure. The computing device 1600 houses a board 1602. The board 1602 may include a number of components, including but not limited to a processor 1604 and at least one communication chip 1606. The processor 1604 is physically and electrically coupled to the board 1602. In some implementations the at least one communication chip 1606 is also physically and electrically coupled to the board 1602. In further implementations, the communication chip 1606 is part of the processor 1604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1606 enables wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1600 may include a plurality of communication chips 1606. For instance, a first communication chip 1606 may be dedicated to shorter range wireless communications such as Wi-Fi and Bluetooth and a second communication chip 1606 may be dedicated to longer range wireless communications such as GPS, EDGE, GPRS, CDMA, WiMAX, LTE, Ev-DO, and others.

The processor 1604 of the computing device 1600 includes an integrated circuit die packaged within the processor 1604. In some implementations of the disclosure, the integrated circuit die of the processor may be packaged in an electronic system that includes a package substrate with a dual-stripline with crosstalk cancellation routing architecture, in accordance with embodiments described herein. The term "processor" may refer to any device or portion of a device that processes electronic data from registers and/or memory to transform that electronic data into other electronic data that may be stored in registers and/or memory.

The communication chip 1606 also includes an integrated circuit die packaged within the communication chip 1606. In accordance with another implementation of the disclosure, the integrated circuit die of the communication chip may be packaged in an electronic system that includes a package substrate with a dual-stripline with crosstalk cancellation routing architecture, in accordance with embodiments described herein. It is to be appreciated that all the elements included in FIG. 16 can be interconnected together using 200 and 800 and/or the structure of FIG. 14.

Thus, Electronic structures including a dual-stripline with crosstalk cancellation have been disclosed.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A printed circuit board (PCB) includes a dual-stripline structure. The dual-stripline structure includes a first region including a first top line vertically over a first bottom line, and a second top line vertically over a second bottom line. The dual-stripline structure also includes a second region including the first top line vertically over the second bottom line, and the second top line vertically over the first bottom line. The dual-stripline structure also includes a transition region between the first region and the second region. The first bottom line and the second bottom line cross in the transition region.

Example embodiment 2: The PCB of example embodiment 1, wherein the first bottom line crosses over the second bottom line in the transition region using a first via and a second via, the first via raising the first bottom line from a plane of the second bottom line to a plane of the first top line and the second top line, and the second via lowering the first bottom line from the plane of the first top line and the second top line to the plane of the second bottom line.

Example embodiment 3: The PCB of example embodiment 2, further including a ground plane beneath the dual-stripline structure, wherein the ground plane does not include a void beneath the transition region.

Example embodiment 4: The PCB of example embodiment 2 or 3, wherein the first top line and the second top line are spaced further apart from one another in the transition region than in the first region and in the second region.

Example embodiment 5: The PCB of example embodiment 1, wherein the first bottom line crosses below the second bottom line in the transition region using a first via and a second via, the first via lowering the first bottom line from a plane of the second bottom line to a lower plane, and the second via raising the first bottom line from the lower plane to the plane of the second bottom line.

Example embodiment 6: The PCB of example embodiment 5, further including a ground plane beneath the dual-stripline structure, wherein the ground plane includes a void beneath the transition region, and wherein the lower plane is in the void.

Example embodiment 7: The PCB of example embodiment 5 or 6, wherein the first top line and the second top line are spaced a same distance from one another in the transition region as in the first region and in the second region.

Example embodiment 8: A package substrate includes a plurality of alternating organic dielectric layers and metal layers. A dual-stripline structure is in the plurality of alternating organic dielectric layers and metal layers. The dual-stripline structure includes a first region including a first top line vertically over a first bottom line, and a second top line vertically over a second bottom line. The dual-stripline structure also includes a second region including the first top line vertically over the second bottom line, and the second top line vertically over the first bottom line. The dual-stripline structure also includes a transition region between the first region and the second region. The first bottom line and the second bottom line cross in the transition region.

Example embodiment 9: The package substrate of example embodiment 8, wherein the first bottom line crosses over the second bottom line in the transition region using a first via and a second via, the first via raising the first bottom line from a plane of the second bottom line to a plane of the first top line and the second top line, and the second via lowering the first bottom line from the plane of the first top line and the second top line to the plane of the second bottom line.

Example embodiment 10: The package substrate of example embodiment 9, further including a ground plane beneath the dual-stripline structure, wherein the ground plane does not include a void beneath the transition region.

Example embodiment 11: The package substrate of example embodiment 9 or 10, wherein the first top line and the second top line are spaced further apart from one another in the transition region than in the first region and in the second region.

Example embodiment 12: The package substrate of example embodiment 8, wherein the first bottom line crosses below the second bottom line in the transition region using a first via and a second via, the first via lowering the first bottom line from a plane of the second bottom line to a lower plane, and the second via raising the first bottom line from the lower plane to the plane of the second bottom line.

Example embodiment 13: The package substrate of example embodiment 12, further including a ground plane beneath the dual-stripline structure, wherein the ground plane includes a void beneath the transition region, and wherein the lower plane is in the void.

Example embodiment 14: The package substrate of example embodiment 12 or 13, wherein the first top line and the second top line are spaced a same distance from one another in the transition region as in the first region and in the second region.

Example embodiment 15: A semiconductor die includes a semiconductor substrate, a plurality of alternating dielectric layers and metal layers above the semiconductor substrate, and a dual-stripline structure in the plurality of alternating dielectric layers and metal layers. The dual-stripline structure includes a first region including a first top line vertically over a first bottom line, and a second top line vertically over a second bottom line. The dual-stripline structure also includes a second region including the first top line vertically over the second bottom line, and the second top line vertically over the first bottom line. The dual-stripline structure also includes a transition region between the first region and the second region. The first bottom line and the second bottom line cross in the transition region.

Example embodiment 16: The semiconductor die of example embodiment 15, wherein the first bottom line crosses over the second bottom line in the transition region using a first via and a second via, the first via raising the first bottom line from a plane of the second bottom line to a plane of the first top line and the second top line, and the second via lowering the first bottom line from the plane of the first top line and the second top line to the plane of the second bottom line.

Example embodiment 17: The semiconductor die of example embodiment 16, further including a ground plane beneath the dual-stripline structure, wherein the ground plane does not include a void beneath the transition region.

Example embodiment 18: The semiconductor die of example embodiment 16 or 17, wherein the first top line and the second top line are spaced further apart from one another in the transition region than in the first region and in the second region.

Example embodiment 19: The semiconductor die of example embodiment 15, wherein the first bottom line crosses below the second bottom line in the transition region using a first via and a second via, the first via lowering the first bottom line from a plane of the second bottom line to a lower plane, and the second via raising the first bottom line from the lower plane to the plane of the second bottom line.

Example embodiment 20: The semiconductor die of example embodiment 19, further including a ground plane beneath the dual-stripline structure, wherein the ground plane includes a void beneath the transition region, and wherein the lower plane is in the void.

Example embodiment 21: The semiconductor die of example embodiment 19 or 20, wherein the first top line and the second top line are spaced a same distance from one another in the transition region as in the first region and in the second region.

What is claimed is:

1. A printed circuit board (PCB) comprising a dual-stripline structure, the dual-stripline structure comprising:
   a first region comprising a first top line vertically over a first bottom line, and a second top line vertically over a second bottom line;
   a second region comprising the first top line vertically over the second bottom line, and the second top line vertically over the first bottom line; and
   a transition region between the first region and the second region, wherein the first bottom line and the second bottom line cross in the transition region.

2. The PCB of claim 1, wherein the first bottom line crosses over the second bottom line in the transition region using a first via and a second via, the first via raising the first bottom line from a plane of the second bottom line to a plane of the first top line and the second top line, and the second via lowering the first bottom line from the plane of the first top line and the second top line to the plane of the second bottom line.

3. The PCB of claim 2, further comprising:
   a ground plane above and beneath the dual-stripline structure, wherein the ground plane does not include a void beneath the transition region.

4. The PCB of claim 2, wherein the first top line and the second top line are spaced further apart from one another in the transition region than in the first region and in the second region.

5. The PCB of claim 1, wherein the first bottom line crosses below the second bottom line in the transition region using a first via and a second via, the first via lowering the first bottom line from a plane of the second bottom line to a lower plane, and the second via raising the first bottom line from the lower plane to the plane of the second bottom line.

6. The PCB of claim 5, further comprising:
   a ground plane beneath the dual-stripline structure, wherein the ground plane includes a void beneath the transition region, and wherein the lower plane is in the void.

7. The PCB of claim 5, wherein the first top line and the second top line are spaced a same distance from one another in the transition region as in the first region and in the second region.

8. A package substrate, comprising:
   a plurality of alternating organic dielectric layers and metal layers; and
   a dual-stripline structure in the plurality of alternating organic dielectric layers and metal layers, the dual-stripline structure comprising:
      a first region comprising a first top line vertically over a first bottom line, and a second top line vertically over a second bottom line;
      a second region comprising the first top line vertically over the second bottom line, and the second top line vertically over the first bottom line; and
      a transition region between the first region and the second region, wherein the first bottom line and the second bottom line cross in the transition region.

9. The package substrate of claim 8, wherein the first bottom line crosses over the second bottom line in the transition region using a first via and a second via, the first via raising the first bottom line from a plane of the second bottom line to a plane of the first top line and the second top line, and the second via lowering the first bottom line from the plane of the first top line and the second top line to the plane of the second bottom line.

10. The package substrate of claim 9, further comprising:
    a ground plane beneath the dual-stripline structure, wherein the ground plane does not include a void beneath the transition region.

11. The package substrate of claim 9, wherein the first top line and the second top line are spaced further apart from one another in the transition region than in the first region and in the second region.

12. The package substrate of claim 8, wherein the first bottom line crosses below the second bottom line in the transition region using a first via and a second via, the first via lowering the first bottom line from a plane of the second bottom line to a lower plane, and the second via raising the first bottom line from the lower plane to the plane of the second bottom line.

13. The package substrate of claim 12, further comprising:
    a ground plane beneath the dual-stripline structure, wherein the ground plane includes a void beneath the transition region, and wherein the lower plane is in the void.

14. The package substrate of claim 12, wherein the first top line and the second top line are spaced a same distance from one another in the transition region as in the first region and in the second region.

15. A semiconductor die, comprising:
    a semiconductor substrate;
    a plurality of alternating dielectric layers and metal layers above the semiconductor substrate; and
    a dual-stripline structure in the plurality of alternating dielectric layers and metal layers, the dual-stripline structure comprising:
       a first region comprising a first top line vertically over a first bottom line, and a second top line vertically over a second bottom line;
       a second region comprising the first top line vertically over the second bottom line, and the second top line vertically over the first bottom line; and a transition region between the first region and the second region, wherein the first bottom line and the second bottom line cross in the transition region.

16. The semiconductor die of claim 15, wherein the first bottom line crosses over the second bottom line in the transition region using a first via and a second via, the first via raising the first bottom line from a plane of the second bottom line to a plane of the first top line and the second top line, and the second via lowering the first bottom line from the plane of the first top line and the second top line to the plane of the second bottom line.

17. The semiconductor die of claim 16, further comprising:
a ground plane beneath the dual-stripline structure, wherein the ground plane does not include a void beneath the transition region.

18. The semiconductor die of claim 16, wherein the first top line and the second top line are spaced further apart from one another in the transition region than in the first region and in the second region.

19. The semiconductor die of claim 15, wherein the first bottom line crosses below the second bottom line in the transition region using a first via and a second via, the first via lowering the first bottom line from a plane of the second bottom line to a lower plane, and the second via raising the first bottom line from the lower plane to the plane of the second bottom line.

20. The semiconductor die of claim 19, further comprising:
a ground plane beneath the dual-stripline structure, wherein the ground plane includes a void beneath the transition region, and wherein the lower plane is in the void.

21. The semiconductor die of claim 19, wherein the first top line and the second top line are spaced a same distance from one another in the transition region as in the first region and in the second region.

* * * * *